United States Patent
Popescu

(10) Patent No.: US 9,689,952 B2
(45) Date of Patent: Jun. 27, 2017

(54) MAGNETIC RESONANCE SYSTEM WITH PULSED COMPENSATION MAGNETIC FIELD GRADIENTS

(71) Applicant: Stefan Popescu, Erlangen (DE)

(72) Inventor: Stefan Popescu, Erlangen (DE)

(73) Assignee: Siemens Aktiengesellschaft, Munich (DE)

(*) Notice: Subject to any disclaimer, the term of this patent is extended or adjusted under 35 U.S.C. 154(b) by 665 days.

(21) Appl. No.: 14/178,704

(22) Filed: Feb. 12, 2014

(65) Prior Publication Data
US 2014/0225610 A1 Aug. 14, 2014

(30) Foreign Application Priority Data
Feb. 12, 2013 (DE) .................. 10 2013 202 217

(51) Int. Cl.
*G01R 33/56* (2006.01)
*G01R 33/565* (2006.01)
(Continued)

(52) U.S. Cl.
CPC ...... *G01R 33/56563* (2013.01); *G01R 33/385* (2013.01); *G01R 33/3806* (2013.01)

(58) Field of Classification Search
CPC .............. G01R 33/4215; G01R 33/387; G01R 33/56563; G01R 33/3875; G01R 33/385; G01R 33/3806; G01R 33/3873
See application file for complete search history.

(56) References Cited

U.S. PATENT DOCUMENTS

| 4,647,858 A | 3/1987 | Bottomley |
| 5,121,060 A | 6/1992 | Doddrell et al. |

(Continued)

FOREIGN PATENT DOCUMENTS

| CN | 102866369 A | 1/2013 |
| JP | 2002062490 A | 2/2002 |

(Continued)

OTHER PUBLICATIONS

Tyszka et al. "Quantification of B0 homogeneity variation with head pitch by registered three-dimensional field mapping" Journal of Magnetic Resonance vol. 159, pp. 213-218, (2002).

*Primary Examiner* — Clayton E Laballe
*Assistant Examiner* — Ruifeng Pu
(74) *Attorney, Agent, or Firm* — Schiff Hardin LLP

(57) ABSTRACT

In order to detect a magnetic resonance (MR) signal in an examination region of an examination subject in a measurement field of an MR system with an MR imaging sequence, a magnetization in the examination subject is generated with a polarization field B0. The MR system has a magnet to generate the polarization field B0 with a first field inhomogeneity across the measurement field. At least one RF pulse is radiated into the examination region. At least one first magnetic field gradient is activated for spatial coding of the MR signal. At least one pulsed compensation magnetic field gradient is activated that is generated by a temporally variable current that varies over the duration of the MR imaging sequence and that is activated over a compensation time period that is shorter than the total duration of the imaging sequence so that, during the compensation time period, the first field inhomogeneity is reduced to a second, lower field inhomogeneity across the measurement field.

25 Claims, 8 Drawing Sheets

(51) Int. Cl.
*G01R 33/38* (2006.01)
*G01R 33/385* (2006.01)

(56) References Cited

U.S. PATENT DOCUMENTS

| | | | |
|---|---|---|---|
| 5,345,178 A | 9/1994 | Manabe et al. | |
| 5,359,289 A * | 10/1994 | van der Meulen | G01R 33/24 |
| | | | 324/318 |
| 5,530,352 A | 6/1996 | Kolem | |
| 5,614,827 A | 3/1997 | Heid | |
| 6,150,815 A | 11/2000 | Janzen et al. | |
| 6,448,773 B1 | 9/2002 | Zhang | |
| 6,687,526 B2 | 2/2004 | Brand et al. | |
| 7,199,585 B2 | 4/2007 | Kruiskamp et al. | |
| 2001/0053877 A1 | 12/2001 | Brand et al. | |
| 2005/0154291 A1* | 7/2005 | Zhao | G01R 33/56375 |
| | | | 600/410 |
| 2006/0244450 A1 | 11/2006 | Kruiskamp et al. | |
| 2009/0174513 A1* | 7/2009 | Ford | G01R 33/3802 |
| | | | 335/299 |
| 2010/0001727 A1* | 1/2010 | Frydman | G01R 33/4822 |
| | | | 324/310 |
| 2010/0253338 A1* | 10/2010 | Eryaman | G01R 33/285 |
| | | | 324/309 |
| 2011/0080168 A1 | 4/2011 | Fenchel et al. | |
| 2011/0241675 A1 | 10/2011 | Constable et al. | |
| 2011/0273177 A1* | 11/2011 | McGinley | H01F 6/00 |
| | | | 324/318 |
| 2012/0153950 A1 | 6/2012 | Katscher | |
| 2012/0235680 A1 | 9/2012 | Blumhagen et al. | |
| 2012/0249137 A1 | 10/2012 | Witschey et al. | |
| 2012/0286783 A1 | 11/2012 | Constable et al. | |
| 2015/0008923 A1* | 1/2015 | Ando | G01R 33/3873 |
| | | | 324/309 |

FOREIGN PATENT DOCUMENTS

| | | |
|---|---|---|
| JP | 2007-316008 A | 12/2007 |
| WO | WO-2012/138902 A1 | 10/2012 |

* cited by examiner

FIG 8
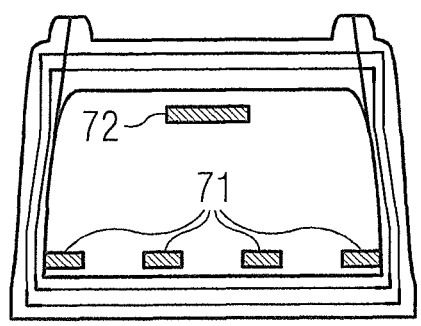
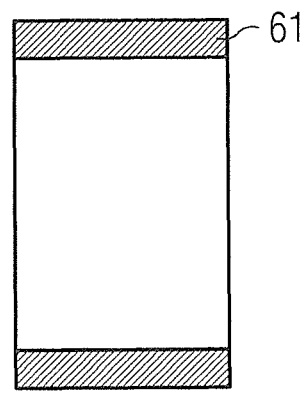
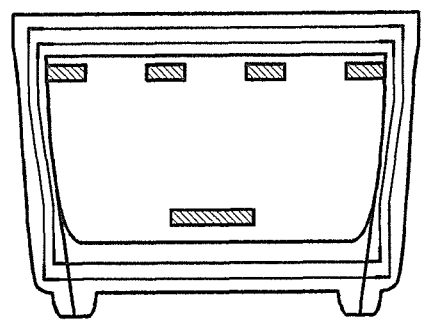

MAGNETIC RESONANCE SYSTEM WITH PULSED COMPENSATION MAGNETIC FIELD GRADIENTS

BACKGROUND OF THE INVENTION

Field of the Invention

The present invention concerns a method for detection of a magnetic resonance (MR) signal in an examination region of an examination subject in a measurement field of an MR system with an MR imaging sequence, as well as an MR system for implementing such a method.

Description of the Prior Art

Known MR systems that use superconducting magnets to create the polarization field B0 typically have a spherical or cylindrical measurement field with a volume approximately 50 cm in diameter. In this measurement field, a high homogeneity of the polarization field is necessary for the creation of MR images. The magnet designs for generating the polarization field B0 are very complicated. For example, many coil elements and additional shielding coil elements are necessary so as to limit the polarization field to the inside of the MR system. Since superconducting magnets are cooled with helium, complicated devices are necessary to cool the many superconducting coils that are present. Each coil element has a number of windings, the position and clearance (separation) of which from the other windows are calculated depending on different criteria, for example with the goal of reducing the amount of superconducting wires. An additional cost-driving factor in MR systems is the consumption of helium for cooling the superconducting coils.

In spite of this, for MR measurements it is sometimes necessary to further improve the basic field homogeneity. For this purpose, shim coils are used that are supplied with a constant current at room temperature in order to further reduce the remaining B0 inhomogeneity. When a person to be examined is moved into the MR system, the currents through the shim coils can be defined as the static shims, which currents remain constant for the imaging. To further improve the homogeneity, it is possible to also adapt the shim currents before every MR imaging sequence. However, the currents used in the shim coils are constant over the duration of the imaging sequence. These shim coils are normally able to compensate for magnetic field inhomogeneities that are on the order of 10 ppm or less. This correction takes place primarily in order to correct B0 inhomogeneities that result due to magnetic susceptibility effects when the examined person is moved into the MR system.

In addition to the high costs for the MR system itself, the opening for introducing the person to be examined should be as small as possible, so as to provide a homogenous polarization field over the measurement field. Due to the restricted space available in the MR magnet, the examination is uncomfortable for many people; examinations of patients with claustrophobia may even be declined due to the restricted available space.

SUMMARY OF THE INVENTION

In view of the above, it is desirable to provide an MR system that has lower overall manufacturing costs due to a smaller magnet, in which less helium is used in the case of a superconducting magnet. It is simultaneously desirable to increase the space in the magnet that is present for the person being examined.

This is achieved by a method and an MR system in accordance with the invention.

The method according to the invention is for detection of an MR signal in an examination region of an examination subject in a measurement field of an MR system using an MR imaging sequence. The MR system has a magnet to generate a polarization field B0 that has a first field inhomogeneity across a measurement field. In one step of the method, a magnetization in the examination subject is generated with the polarization field B0. Furthermore, at least one RF pulse is radiated into the examination region to deflect the magnetization, the deflected magnetization being used to generate the MR signal. Furthermore, at least one first magnetic field gradient is activated for spatial coding of the MR signal. At least one pulsed compensation magnetic field gradient is additionally activated that is generated by a temporally variable current that varies over the duration of the MR imaging sequence. The compensation magnetic field gradient is furthermore activated during a compensation time period that is shorter than the total duration of the imaging sequence, such that the first field homogeneity is reduced to a second, lower field inhomogeneity across the measurement field during the compensation time period. The MR signal can then be detected.

By the use of pulsed compensation magnetic field gradients, it is possible to use MR systems that have a lower field homogeneity, i.e. a greater field inhomogeneity than existing MR systems. If a greater homogeneity across the measurement field is necessary during the MR imaging sequence, pulsed compensation magnetic field gradients can be switched that significantly reduce the intrinsically present greater magnetic field inhomogeneity over a desired time period. More simply designed magnets can be used. In the case of superconducting magnets, fewer coil elements can be used, so less coolant is necessary. Furthermore, it is possible to use more open structural shapes because lower requirements exist for the basic field homogeneity.

The invention furthermore concerns an MR system to generate an MR signal with an MR imaging sequence. The MR system has a magnet to generate the polarization field B0 with a first field inhomogeneity. Furthermore, an RF unit is provided that is designed to radiate at least one RF pulse into the examination region to deflect the magnetization. An MR signal can then be generated with the deflected magnetization. A gradient unit is provided that is designed to switch at least one first magnetic field gradient for spatial coding the MR signal and at least one pulse compensation magnetic field gradient. This pulsed compensation magnetic field gradient is generated by temporally variable, non-constant currents that vary over the duration of the imaging sequence and that are switched over a compensation time period that is shorter than the total duration of the imaging sequence. The gradient unit can be designed in order to switch the first magnetic field gradient and the pulsed compensation magnetic field gradient as explained in detail above.

For example, it is possible for the first field inhomogeneity across the measurement field (i.e. across the region inside the MR magnet in which MR images can be generated) to be greater than 1 mT, preferably greater than 10 mT, and furthermore greater than 20 mT.

Furthermore, the second field inhomogeneity can be greater by a factor of 100 than the first field inhomogeneity. This means that the second field inhomogeneity is less by a factor of 100 than the first field inhomogeneity. However, the factor can also amount to a value of 500 or 1000. This means that the field inhomogeneity is reduced by a factor that is between 100 and 1000 due to the pulsed compensation magnetic field gradient.

It is possible for the at least one first magnetic field gradient and the at least one pulse compensation magnetic field gradient to be respectively determined by a weighted linear combination of linear gradients and gradients of a higher order. The pulsed compensation magnetic field gradient as well as the first magnetic field gradient for the spatial coding or, respectively, the readout of the signal can be viewed as a series expansion, wherein not just linear terms but also terms of a higher power are used to describe the exact gradient curve. The gradient curve can also have quadratic and cubic terms. The applied gradients (both the magnetic field gradients for spatial coding and the pulsed compensation magnetic field gradients) can be a linear combination of linear gradients (for example in the GxGyGz-direction) and gradients of a higher power, for example $Gz^2$, Gzx, Gzy, $GX^2-Y^2$, Gxz, $Gz^2x$, $Gz^2y$, $Gx^3$, $Gy^3$, . . . .

The second field inhomogeneity, which predominates over the measurement field when the at least one pulsed compensation magnetic field gradient is switched, is advantageously less than 20 microtesla. Furthermore, it can be less than 10 microtesla or 5 microtesla.

It is possible for the at least one RF pulse to be activated over a first time period, with the pulsed compensation magnetic field gradient being activated during the compensation time period that essentially corresponds to the first time period. In this embodiment, the pulsed compensation magnetic field gradient is essentially switched at the same time as the time period during which the RF pulse is radiated. For example, for the excitation of a defined slice, it is necessary that the spins have a frequency in the desired slice to be excited, which frequency lies within the bandwidth of the RF excitation pulse. This can be achieved by, for the radiation of the RF pulse, activating the pulsed compensation magnetic field gradient in order to achieve the desired homogeneity of the polarization field so that a predefined slice profile in the examined person can be excited. This slice profile can be planar or curved, for example to excite a defined anatomy.

Furthermore, it is possible for either a first magnetic field gradient and/or a pulsed compensation magnetic field gradient to always be activated over the duration of the MR imaging sequence. Since the basic field homogeneity can be significantly less than for conventional magnets, it can be necessary for either a gradient for spatial coding or the compensation magnetic field gradient to be activated during the imaging sequence in order to prevent signal decay of the transverse magnetization that is too strong.

For example, if multiple RF pulses are radiated in an imaging sequence, these compensation magnetic field gradients can be activated simultaneously with the radiation of the multiple RF pulses, but the compensation magnetic field gradient is not permanently switched constantly over the entire duration of the imaging sequence. However, the switching of the pulsed compensation magnetic field gradients is not limited to time periods in which RF pulses are radiated in the MR imaging sequence. In imaging sequences that require certain variable delay periods between the RF pulse and the signal readout, it is possible to also switch the temporally variable compensation magnetic field gradients in order to achieve certain delays before the signal readout.

Furthermore, it is possible to calculate a B0 field map that shows the spatial dependency of the first field inhomogeneity across the measurement field, with a spatially dependent compensation magnetic field being calculated that is generated with the at least one pulsed compensation magnetic field gradient in order to reduce the first field inhomogeneity to the second field inhomogeneity.

The methods described above can use multiple gradient coils for the various spatial directions to generate the first magnetic field gradients and the compensation magnetic field gradients. If first magnetic field gradients and a pulsed compensation magnetic field gradient are switched simultaneously, the weighting coefficients of the weighted linear combination for the individual gradient coils can be calculated individually and be added arithmetically in order to calculate in total the amperages that are required in the various gradient coils. This means that the weighting coefficients for the determination of the gradients in the individual spatial directions (that are calculated from a weighted linear combination) are respectively calculated for the first magnetic field gradient and the pulsed compensation magnetic field gradient and added arithmetically. The technique described above can also be combined with multiple RF transmission channels. Arbitrary excitation profiles of the magnetization in the examination subject can be achieved by the combination of gradient curves that have linear terms and terms of higher powers and the use of multiple RF transmission channels.

Furthermore, it is possible for the first field inhomogeneity to be described by a nonlinear gradient curve whose spatial curve is described by the following Equation:

$$G(x,y,z)=z^2-(x^2+y^2)/2.$$

The compensation magnetic field gradient can have this curve according to the above equation. The use of nonlinear gradients in the signal readout is also known as what is known as an O-space coding method and is described in detail in WO 2010/068299. In the present case, this gradient curve is applied in the compensation gradient.

Furthermore, multiple reception coils can simultaneously detect the MR signal, wherein the reception coils respective have a reception coil sensitivity; wherein the reception coil sensitivities, the magnetic field compensation gradient and the first magnetic field gradient for spatial coding of the MR signal are used or, respectively, calculated according to the O-space method or according to the null space method. The null space technique is described in detail in WO 2011/087847 A2 with gradients of the 2nd and 3rd power.

The MR signal can be a spin echo signal, wherein a 90° RF pulse is radiated into the examination region over a first time period and a 180° RF pulse is radiated over a second time period. The pulsed compensation magnetic field gradient can then be switched over the compensation time period that corresponds to the first time period and the second time period, wherein the compensation time period can be limited to these two time periods (in the event that the compensation magnetic field gradient is not switched again) in order to achieve defined delay times between signal excitation and readout.

The signal can also be a gradient echo, with the α-pulse being radiated into the examination region over the first time period. The pulsed compensation magnetic field gradient is then switched over the compensation time period, which corresponds to the first time period.

It is possible for the magnet to be a superconducting magnet with in total only four coil elements that generate the polarization field in the z-direction, with two first coil elements at a first end of the magnet in the z-direction and two additional coil elements at the other end of the magnet in the z-direction. Of the in total four coil elements, two coil elements can be present that primarily generate the polarization field B0, wherein two additional coil elements are provided that produce an active shielding of the magnetic field against external influences.

Furthermore, the gradient unit can use a gradient coil that is designed with two coil portions separated from one another in the direction of the polarization field B0. With these parts of the gradient coil, the field of view is further extended for the examined person, whereby a claustrophobia that can possibly occur in the magnet can be further reduced. Furthermore, it is possible that the magnet has a very short structural shape in the direction of the polarization field. The high inhomogeneity of the polarization field that results can be compensated by a gradient coil that has a size that projects beyond the coil elements on both sides in the direction of the polarization field, which coil elements generate said polarization field. Due to the fact that greater field inhomogeneities of the field B0 are allowed, the opening for the person to be examined can also be enlarged. Persons with claustrophobia can thereby also be better examined.

BRIEF DESCRIPTION OF THE DRAWINGS

FIG. 8 is a schematic cross-section through an additional embodiment of the MR system according to the invention.

DESCRIPTION OF THE PREFERRED EMBODIMENTS

Figure 1:
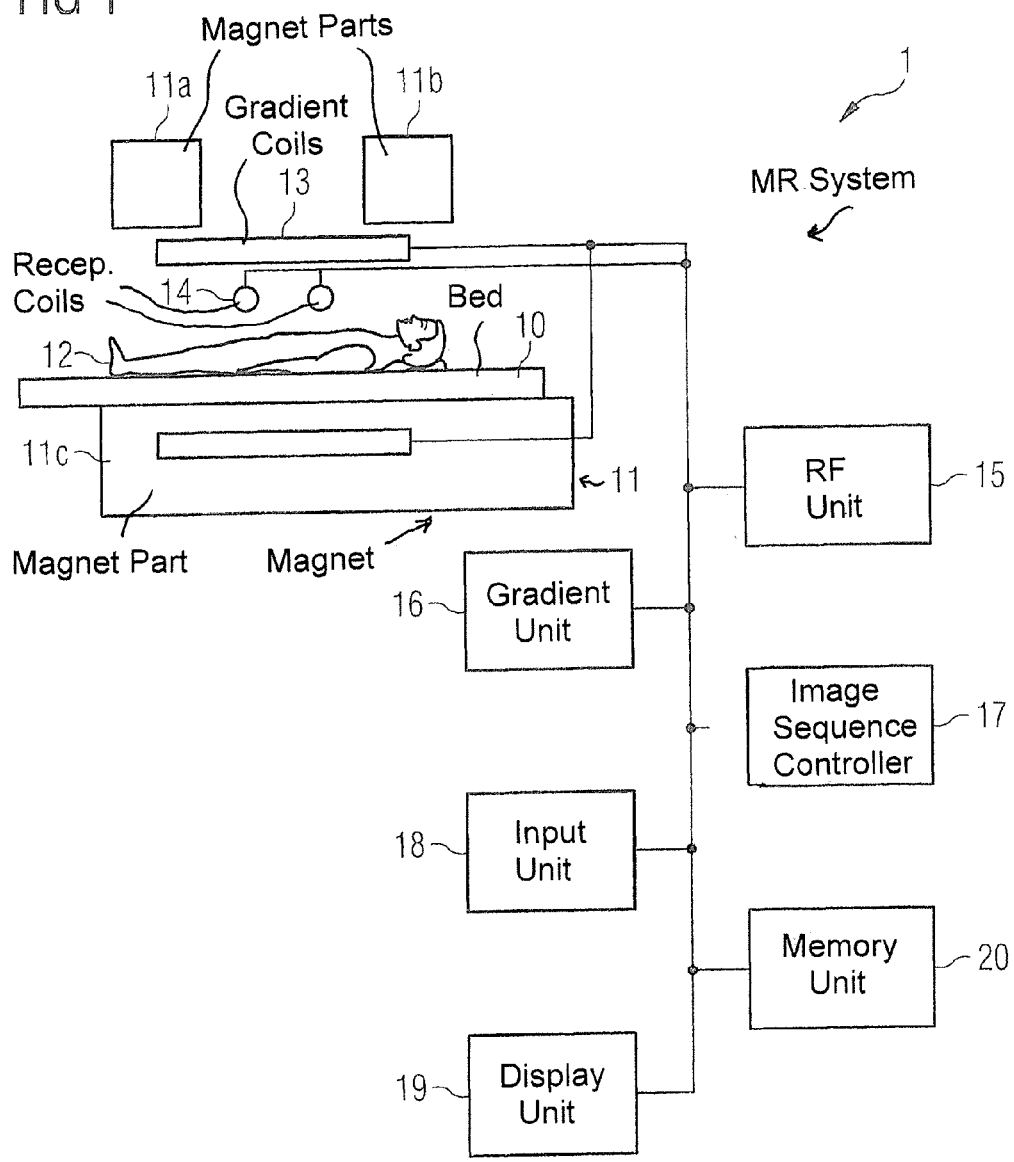
FIG. 1 schematically illustrates an MR system that operates with pulsed compensation magnetic field gradients.

An MR system 1 in which polarization fields with a greater field inhomogeneity than has previously typically can be used is schematically shown in FIG. 1, wherein the field inhomogeneity is achieved via switching of an additional pulsed compensation magnetic field gradient at points in time in which a greater field inhomogeneity is necessary. The MR system 1 has a magnet 11 that (for example) can comprise two coil elements, respectively at the forward and rear end of a magnet. For example, the magnet can be constructed to be open at the top and at the sides. The lower element of the two coil elements can be closed in order to provide the cooling necessary for the two coil elements in the lower part 11c of the magnet. The forward and rear coil elements can be accommodated in the two separate parts 11a and 11b. A person 12 being examined who is arranged on a bed 10 lies in the magnet so that a resulting magnetization in the direction of the polarization field B0 is generated in the examined person via said polarization field B0. The gradient coils 13 with which the first magnetic field gradients for spatial coding of the MR signals are first switched are schematically depicted. The gradient coils 13 are also used in order to switch a pulsed compensation magnetic field gradient that homogenizes the polarization field B0 generated by the magnet 11 so far that MR images can be generated. The MR signal can be detected in a typical manner via reception coils 14 that are likewise schematically depicted in FIG. 1. The MR system furthermore has an RF unit 15 to generate the RF pulses with which the magnetization in the examined person 12 is deflected. A gradient unit 16 calculates the magnetic field gradient necessary for the spatial coding of the MR signal and furthermore calculates a pulsed compensation magnetic field gradient that is switched in order to reduce the intrinsic magnetic field inhomogeneity to a second, lesser magnetic field gradient inhomogeneity. The generation of the gradients themselves takes place via the gradient coils 13. An image sequence controller 17 controls the workflow of an MR imaging sequence with the controller of the gradient unit 16 and the RF unit 15 in order to coordinate the chronological order of the radiation of the RF pulses and the switching of the gradients. Via an input unit 18 an operator (not shown) can operate the MR system, select image sequences, set imaging parameters, select measurement planes etc. The MR images can be presented at a display unit 19. A memory unit 20 can store the generated MR images as well as imaging sequences and other information that are necessary to create MR images of the examined person.

How MR images can be generated in principle by a sequence of RF pulses and gradients for spatial coding of the MR signals is known to those skilled in the art and need not be explained in detail herein. The gradient coils 13 are designed so that they can be operated in a pulsed operating mode and can compensate magnetic field inhomogeneities that are in the range of millitesla across a measurement field.

Figure 4:
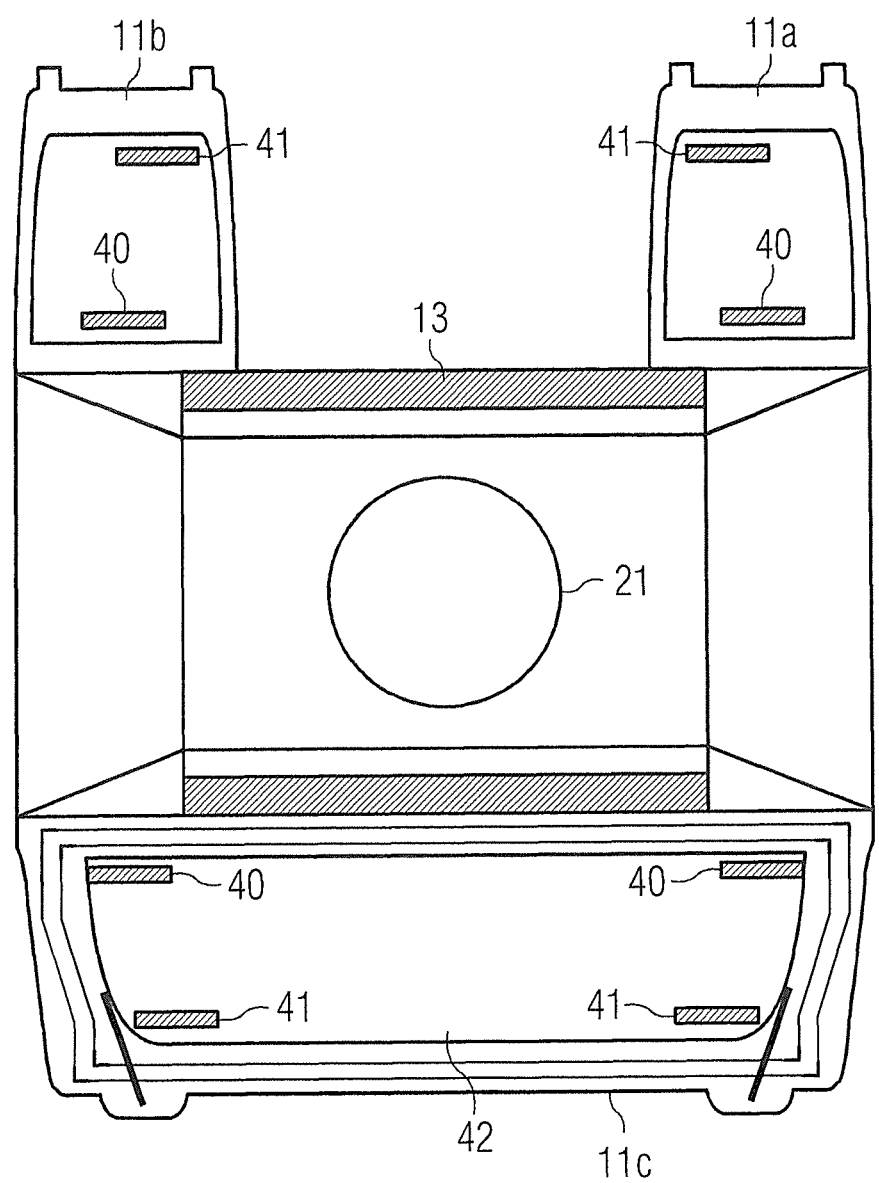
FIG. 4 is a schematic cross-section through an embodiment of the MR system according to the invention.

For example, the polarization field generated by the magnet 11 can have a first field inhomogeneity over 20 mT, or over 50 mT, across a measurement field of the MR system (for example the measurement field 21 of FIG. 4).

A cross-section of an MR system is presented as an example in FIG. 4. In the presented case, the MR system is an MR system in which the magnetic field is generated by a superconducting magnet. As will be explained below in connection with FIG. 9, however, the invention is not limited to superconducting magnets. In the embodiment presented in FIG. 4, the superconducting magnet has two coil elements (or windings), namely primary windings 40 that predominantly generate the polarization field B0 and active shielding windings 41 that shield the magnetic field against outside influences. The two windings are respectively accommodated in both parts 11a and 11b, as well as below in the common part 11c. The common part 11c has a common vacuum region 42 for cooling the coil elements 40 and the shielding windings 41. The gradient coil 13 is an actively shielded gradient coil, and this gradient coil is in the position to generate the pulsed compensation magnetic field gradient (in addition to the first magnetic field gradient for spatial coding) with which the polarization field is largely homogenized and with which the inhomogeneities are compensated. As noted above, the field inhomogeneity across the measurement field 21 can be in the range of millitesla without switching of the additional compensation magnetic field gradient. By switching the additional compensation magnetic field gradient, this field inhomogeneity can be reduced to a second field inhomogeneity that is in the range of microtesla, such that the field inhomogeneity is reduced by a factor that can be in the range of 1000. Naturally, it is also possible that the factor can also have a value of 100 or 500, as well as a value of 2000.

From FIG. 4 it can be seen that—in comparison to known superconducting magnets—only a small number of coil elements must be used since the requirements for the basic field homogeneity are lower.

Figure 2:
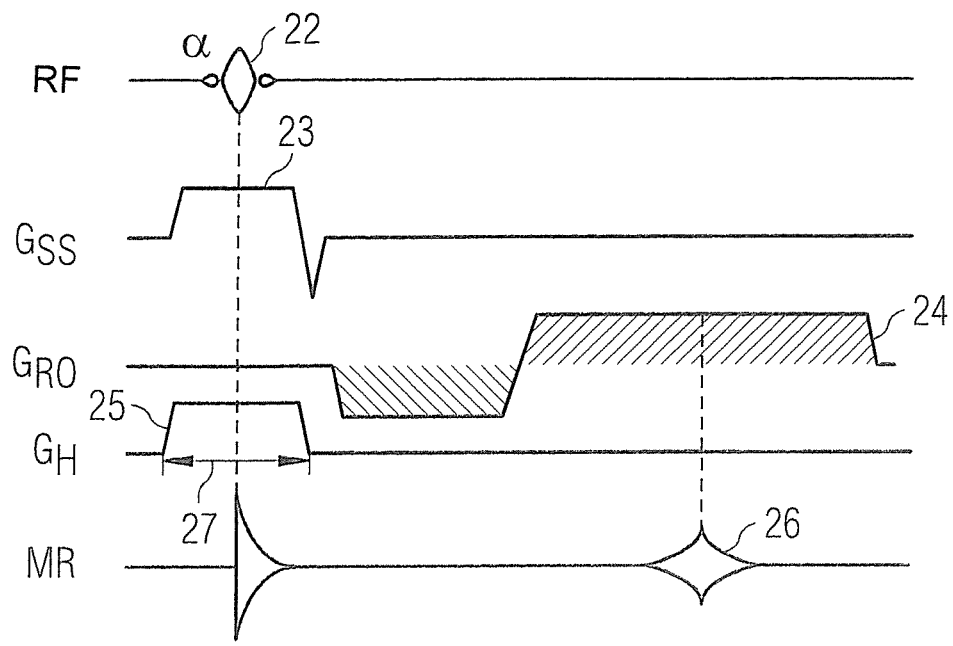
FIG. 2 schematically shows the sequence workflow of a gradient echo sequence using the compensation magnetic field gradients.

With reference to FIG. 2, it is shown how the MR system that is shown in FIG. 1 or FIGS. 4-9 operates in order to compensate for the intrinsic first magnetic field inhomogeneity. A gradient echo sequence is presented in FIG. 2. As is known, in a gradient echo sequence an α-pulse 22 is radiated during the switching of a slice-selection gradient 23. For signal readout, a readout gradient 24 is switched. In addition to the known switched gradients, a likewise pulsed compensation magnetic field gradient 25 is switched that is designated as $G_H$ or a "hypergradient". In the presented exemplary embodiment of a gradient echo sequence, this compensation magnetic field gradient 25 is switched during a compensation time period 27 that corresponds to the time period in which the a-pulse 22 is radiated. For example, the spins of a defined slice profile can be selected via the switching of this gradient 25 since the homogeneity of the B0 field (and therefore the Larmor frequency of the spin) is homogenized via the switching of the compensation magnetic field gradient 25 such that the spins in the slice profile that are defined by the bandwidth of the radiated a-pulse are excited. The gradient $G_H$ 25 can be described as a linear combination of a function that also has a gradient portion of a higher power in addition to linear gradient portions. It is likewise possible to describe the function generally as a series expansion or as a polynomial to the nth power, wherein coefficients for the weighting of the individual powers are used for every power and direction. For example, twelve coefficients can be used for the powers x, y, z, $z^2$, zx, zy, $x^2-y^2$, xy, $z^2x$, $z^2y$, $x^3$, $y^3$.

| l | m | Power | fm$^l$(x, y, z) |
|---|---|---|---|
| 1 | 0 | Z | z |
| 1 | 1 | X | x |
| 1 | -1 | Y | y |
| 2 | 0 | $Z^2$ | $z^2 - (x^2 + y^2)/2$ |
| 2 | 1 | ZX | zx |
| 2 | -1 | ZY | zy |
| 2 | 2 | $X^2 - Y^2$ | $x^2 - y^2$ |
| 2 | -2 | XY | 2xy |
| 3 | 1 | $Z^2X$ | $z^2x - x(x^2 + y^2)/2$ |
| 3 | -1 | $Z^2Y$ | $z^2y - y(x^2 + y^2)/4$ |
| 3 | 3 | $X^3$ | $3x^3 - 3xy^2$ |
| 3 | -3 | $Y^3$ | $3x^2y - y^3$ |

Gradient coils can now be designed such that they essentially respectively affect one of these coefficients or, respectively, one of these powers, thus that compensate the field interference corresponding to this coefficient.

With this linear combination, a magnetic field distribution can be calculated such that the field inhomogeneities are reduced (and in the ideal case canceled) by the application of the compensation magnetic field gradient. For example, the MR system can calculate a B0 field map at the start (or this can be permanently stored in the MR system) which shows the spatial dependency of the intrinsic first field inhomogeneity. This can also be calculated if the examined person lies in the magnet, and therefore if the subject-dependent distortions are taken into account. The gradient unit 16 can then calculate a spatially dependent compensation magnetic field gradient that is generated with gradient coils.

All gradients presented in FIG. 2 can be determined by the linear combination of linear gradients and gradients of a higher power. The slice-selection gradient 23 is also a gradient that generates not only a linear magnetic field gradient but rather a gradient curve of a higher power. Arbitrary slice profiles can thereby also be excited in the examined person. This also applies to the readout gradient 24. Via the use of nonlinear readout gradients it is possible to combine the MR system according to the invention with what is known as the O-space technique. In this O-space technique, the spatial signal coding is achieved with [a] parallel acquisition technique in which the gradient coil has an additional $Z^2$ winding, for example. In the invention, this $Z^2$ gradient Gz$^2$ can be part of the intrinsic first field inhomogeneity. Furthermore, the MR system can be combined with what is known as the O-space technique. The sensitivities of the multiple reception coils and gradient fields that are used are calculated as described in WO 2011/087847, and the spatial signal coding is achieved by means of nonlinear readout gradients of the 2nd power and 3rd power as described in the above table.

Figure 3:
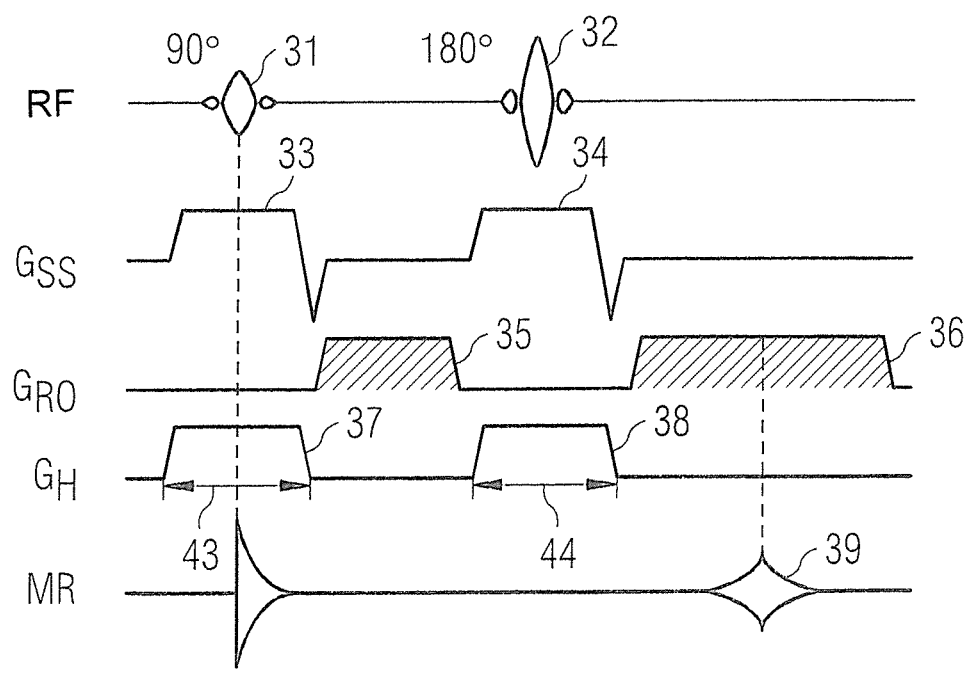
FIG. 3 schematically shows the sequence diagram of a spin echo sequence with use of a pulsed compensation magnetic field gradient.

In FIG. 3, the gradient switching is shown with the use of the compensation magnetic field gradient in a spin echo. As is known, a 90° excitation pulse 31 and a 180° refocusing pulse 32 are radiated into the examined person. The slice-selection gradients 33 and 34 are chronologically switched as shown. The readout gradients 35, 36 are likewise switched. As shown in FIG. 3, the compensation magnetic field gradients 37 and 38 are additionally switched during the compensation time periods 43 or, respectively, 44, essentially simultaneously with the radiation of the RF pulses 31 and 32. These gradients 37 and 38 generate the necessary magnetic field homogeneity profiles that are necessary in the radiation of the RF pulses in order to be able to excite predefined geometries of spins. The spin echo 39 is read out as is typical during the readout gradient 36.

In the examples presented in FIGS. 2 and 3, the compensation magnetic field gradients are switched (activated) only during the radiation of the RF pulses. However, it is also possible for the compensation magnetic field gradients to also be switched without an RF pulse being radiated, for example in the event that a delay time is desired between radiation of an RF pulse and the signal readout.

As can be seen in FIGS. 2 and 3, either a slice selection gradient or a pulsed compensation magnetic field gradient is advantageously always switched. This has the advantage that the resulting transverse magnetization is less strongly reduced due only to the magnetic field inhomogeneity.

The duration that is necessary to generate an MR image—i.e. until the raw data space is scanned far enough in order to generate an MR image with the desired resolution—is defined as a duration.

For example, the individual gradients of FIGS. 2 and 3 can be calculated via the following Equation:

$$G_{SS}=k_{SS,1}G_X+k_{SS,2}G_Y+k_{SS,3}G_Z+k_{SS,4}G_{Z^2}+k_{SS,5}G_{ZX}+ \\ k_{SS,6}G_{ZY}+k_{SS,7}G_{X^2-Y^2}+k_{SS,8}G_{XY}+ \ldots \ G_{RO}= \\ k_{RO,1}G_X+k_{RO,2}G_Y+k_{RO,3}G_Z+k_{RO,4}G_{Z^2}+k_{RO,5}G_{ZX}+ \\ k_{RO,6}G_{ZY}+k_{RO,7}G_{X^2-Y^2}+k_{RO,8}G_{XY}+ \ldots \ G_H= \\ k_{H,1}G_X+k_{H,2}G_Y+k_{H,3}G_Z+k_{H,4}G_{Z^2}+k_{H,5}G_{ZX}+ \\ k_{H,6}G_{ZY}+k_{H,7}G_{X^2-Y^2}+k_{H,8}G_{XY}+ \ldots \quad (1)$$

In the event that multiple gradients (as shown in FIGS. 2 and 3) are now switched simultaneously, the weighting coefficients of Equation 1 are arithmetically summed for every individual gradient coil and a final weighting value results for every function that is used in order to calculate the amperage that is necessary in the corresponding winding of the gradient coil in order to generate a desired magnetic field gradient.

The invention is naturally not limited to imaging sequences such as gradient echo sequences and spin echo sequences; rather, it is possible to use all other known imaging sequences. The compensation magnetic field gradient can hereby be switched again briefly during the radiation of the RF pulses, like the other gradients, or can also be switched alone if—as given the inversion of a magnetization—a delay time period between inversion and signal readout is desired.

Figure 5:
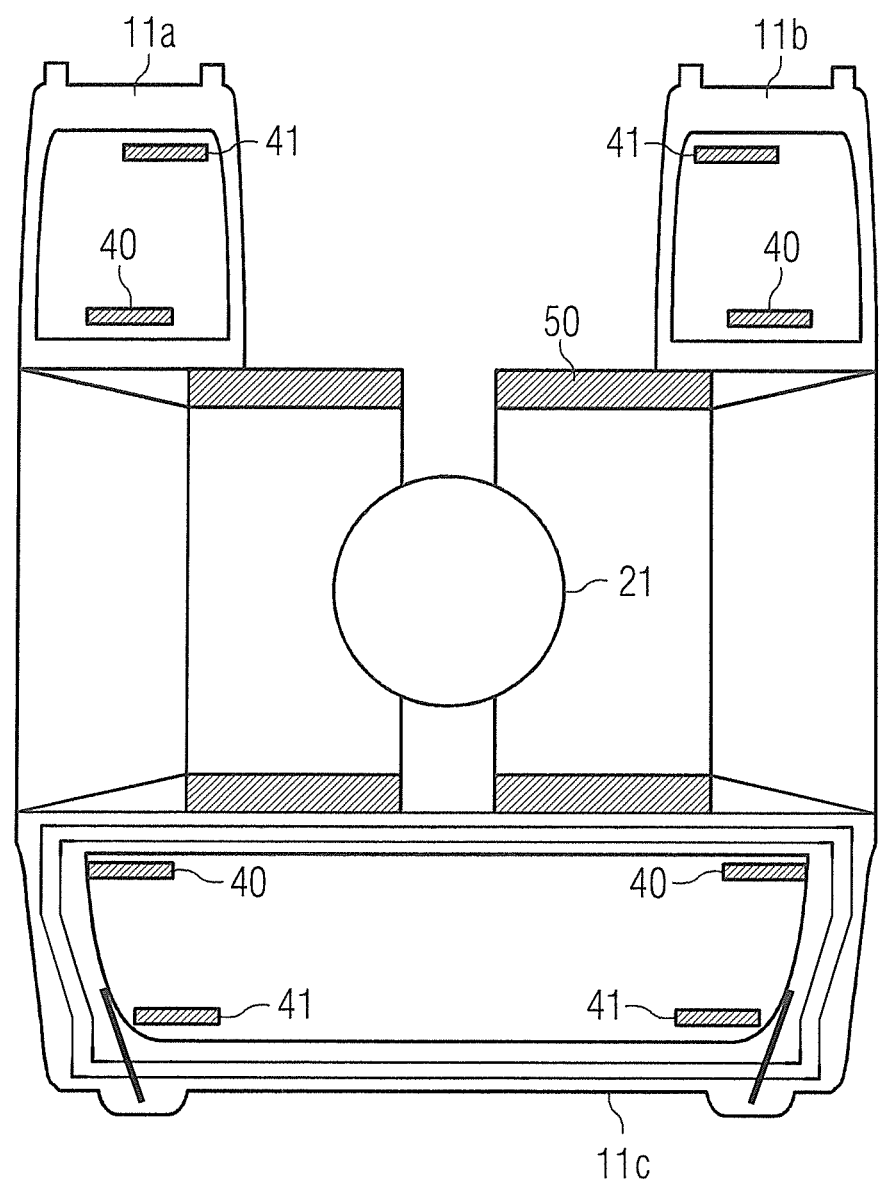
FIG. 5 is a schematic cross-section through an additional embodiment of the MR system according to the invention.

An additional embodiment according to the invention is presented in FIG. 5. The embodiment presented in FIG. 5 is similar to the embodiment presented in FIG. 4, wherein the same components have the same reference characters. As is apparent, in the embodiment of FIG. 5 a gradient coil 50 has been used that is fashioned in two parts. This allows an additional opening of the field of view for the examined person. With the two-part coil, it is also possible to position other therapy devices (such as a radiation therapy device or surgical instruments) on the examined person.

In FIG. 6, an embodiment is again shown in which a smaller gradient coil 61 can be used, for example. A whole-body gradient coil is not necessary; it is possible to use a much smaller coil tailored to the examination region. This coil 61 furthermore has an integrated RF coil arrangement to radiate the RF pulses.

Figure 7:
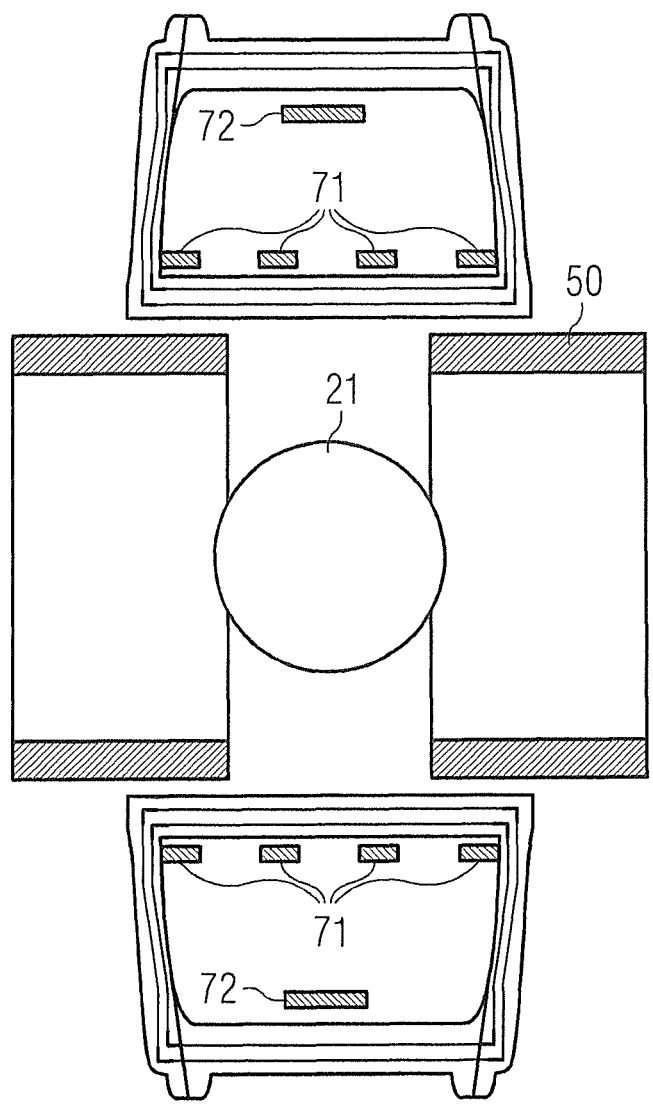
FIG. 7 is a schematic cross-section through an additional embodiment of the MR system according to the invention.

An additional embodiment according to the invention is shown in FIG. 7, in which the magnet structure is designed to be shorted in the direction of the polarization field B0 relative to the other exemplary embodiments. For example, the magnetic field can be generated by four coil elements 71 with the use of a shielding coil element 72. This magnet structure can be combined with the two-part gradient coil 50 of FIG. 5. Since the magnetic field inhomogeneity in the measurement field 21 is particularly large at the outer edge due to the short structural shape, the gradient coils can project beyond the longitudinal axis of the magnet in order to increase the magnetic field homogeneity in the measurement field.

Figure 6:
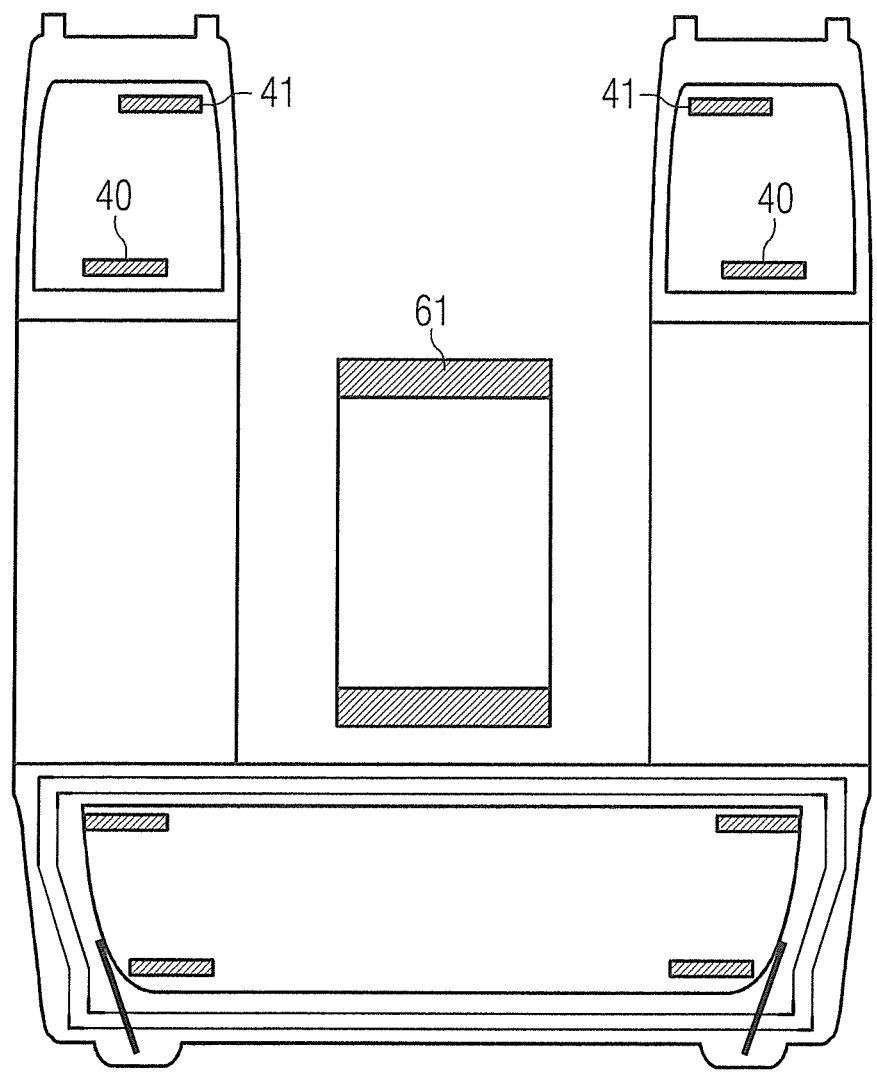
FIG. 6 is a schematic cross-section through an additional embodiment of the MR system according to the invention.

In the embodiment shown in FIG. 8, the magnet structure from FIG. 7 is combined with the gradient coil 61 from FIG. 6. For example, if only exposures in the head are important, the gradient coil 61 can be an integrated coil that also serves as a transmission and reception coil. As is apparent in FIG. 8, in such an MR system a larger provided space exists in the magnet since only the control unit 61 is provided, but otherwise there are no geometric limitations that can cause a feeling of feeling of tightness to arise.

Figure 9:
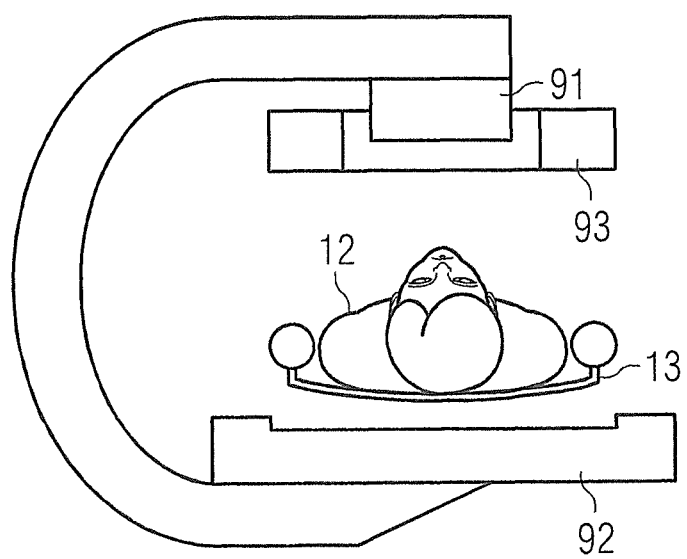
FIG. 9 schematically illustrates an additional MR system according to the invention, wherein the magnet is a C-arm.

The magnet of an MR system is schematically shown in FIG. 9. This MR system has no superconducting magnet, but rather a C-arm magnet in which the polarization field B0 is generated by the two pole shoes 91 and 92. In the shown embodiment, the B0 field has a strong inhomogeneity with a spatial distribution that can be described by the $Z^2$ of the table cited above. According to the invention, this inhomogeneity could be compensated by a whole-body gradient coil 93 that compensates this $Z^2$ gradient curve as a magnetic field compensation gradient.

In summary, the present invention enables the correction of B0 field inhomogeneities in orders of magnitude that are in the range of millitesla, for example ±25 millitesla or more. The gradient coils have variable currents flowing therein that are not constant over the time period of the imaging sequence. This field compensation takes place by these currents in the coils in order to generate the compensation magnetic field gradient. These coils are not superconducting. These currents are pulses in the measurement sequence, similar to the currents that are used for spatial coding. To minimize the spin dephasing, it is possible to configure the imaging sequences such that time periods without switching of gradients (either a first gradient or a magnetic field compensation gradient) are avoided.

Furthermore, multiple radiation channels can be used in order to achieve homogenous flip angle distributions or defined excitation profiles, or to achieve selective slice profiles, for example.

It is additionally possible to use pulses known as chirp-modulated RF pulses. If the compensation of the first magnetic field inhomogeneity is not achieved in a range of (for example) 5-10 ppm across the measurement field, a broadband RF pulse can be used instead of a narrowband RF pulse. These RF pulses can be the chirp-modulated RF pulses.

Although modifications and changes may be suggested by those skilled in the art, it is the intention of the inventor to embody within the patent warranted hereon all changes and modifications as reasonably and properly come within the scope of his contribution to the art.

I claim as my invention:

1. A method for acquiring magnetic resonance (MR) data in an examination region of an examination subject situated in a measurement region of an MR data acquisition unit, said MR data acquisition unit comprising a basic field magnet, a radio-frequency (RF) system, and a gradient coil system, said method comprising:

operating said basic field magnet of said MR data acquisition unit, with said examination region situated in said measurement region, to produce a polarization field in said measurement region that gives nuclear spins in the examination region a magnetization, said polarization field having a first field inhomogeneity across said measurement region;

operating said MR data acquisition unit according to an MR imaging sequence having a sequence duration and, in said MR imaging sequence, operating said RF system to radiate at least one RF pulse into the examination region that deflects said magnetization and thereby causes said nuclear spins to emit an MR signal;

in said MR imaging sequence, operating said gradient coil system of said MR data acquisition unit to activate a spatially encoding magnetic field gradient that spatially codes said MR signal;

operating said gradient coil system of said MR data acquisition unit to activate at least one pulsed compensation magnetic field gradient during a compensation time interval in said MR imaging sequence that is shorter than said sequence duration and that occurs relative to the radiation of the at least one RF pulse so as to make said compensation field gradient effective during said at least one RF pulse, by supplying a temporally variable current, that is varying over said sequence duration, to said gradient coil system, and configuring said at least one pulsed compensation magnetic field gradient to reduce said first field inhomogeneity during said compensation time period to a second field inhomogeneity across said measurement region that is less than said first field inhomogeneity;

operating said MR data acquisition unit to detect said MR signal at least in said compensation time period; and converting the detected MR signal into an electrical signal representing raw MR data and entering said raw MR data into an electronic memory, to produce a raw data set in a form that is accessible from said electronic memory for conversion into an image of the examination region.

2. A method as claimed in claim 1 comprising operating said basic field magnet of said MR data acquisition unit to generate said polarization field with said first field inhomogeneity being larger than one mT.

3. A method as claimed in claim 1 comprising configuring said at least one pulsed compensation magnetic field gradient to reduce said first field inhomogeneity by a factor of at least 100.

4. A method as claimed in claim 1 comprising configuring said at least one pulsed compensation magnetic field gradient to reduce said first field inhomogeneity by a factor of 1,000.

5. A method as claimed in claim 1 comprising operating said gradient coil system of said MR data acquisition unit to activate said at least one spatially encoding magnetic field gradient and to activate said at least one pulsed compensation magnetic field gradient, respectively, as a weighted linear combination of linear gradients and gradients of an order higher than said linear gradients.

6. A method as claimed in claim 5 wherein said gradient field system comprises a plurality of gradient coils and activating each of said at least one spatially encoding magnetic field gradient and said at least one pulsed compensation magnetic field gradient using multiple coils among said plurality of coils.

7. A method as claimed in claim 6 comprising simultaneously activating said at least one spatially encoding magnetic field gradient and said at least one pulsed compensation magnetic field gradient, and supplying respective currents to said multiple coils having respective amperages for which weighting coefficients of the weighted linear combination are calculated individually, for the respective gradient coils, and are added together.

8. A method as claimed in claim 5 wherein said at least one pulsed compensation magnetic field gradient is configured to produce said second field inhomogeneity across the measurement field with a value that is less than 10 µT.

9. A method as claimed in claim 1 comprising operating said RF system of said MR data acquisition unit to radiate said at least one RF pulse during an RF radiation period, and operating said gradient coil system of said MR data acquisition unit to activate said at least one pulsed compensation magnetic field gradient with said compensation time period substantially corresponding to said RF radiation period.

10. A method as claimed in claim 1 comprising operating said MR data acquisition unit to only activate said spatially encoding magnetic field gradient or said pulsed compensation magnetic field gradient in said sequence duration.

11. A method as claimed in claim 1 comprising:
operating said MR data acquisition unit to detect said first field inhomogeneity, as detected field inhomogeneity information, and supplying said detected field inhomogeneity information to a processor and, in said processor, calculating a field map of said polarization field from the detected inhomogeneity information, said polarization field not representing a spatial dependency of said first field inhomogeneity; and
configuring said at least one pulsed compensation magnetic field gradient to reduce said first field inhomogeneity to said second field inhomogeneity by calculating, in said processor, a configuration of said variable current from the spatial dependency of the first field inhomogeneity in order to cause said at least one pulsed compensation magnetic field gradient to have a spatial dependency that reduces said first field inhomogeneity to said second field inhomogeneity.

12. A method as claimed in claim 1 comprising configuring said MR image sequence to cause said MR signal to be detected as a spin echo by operating said RF system to radiate a 90° RF pulse in said examination region during a first time period and to radiate a 180° RF pulse into said examination region in a second time period, and operating said gradient coil system to activate said at least one pulsed compensation magnetic field gradient with said compensation time period set to correspond to a sum of said first time period and said second time period.

13. A method as claimed in claim 1 comprising operating said MR data acquisition unit with said pulse sequence configured to detect said MR signal as a gradient echo by operating said RF system to radiate said at least one RF pulse as an α pulse during an α pulse time period, wherein α≤90°, and operating said gradient coil system to activate said compensation magnetic field gradient with said compensation time period corresponding to said α pulse time period.

14. A method as claimed in claim 1 wherein said RF system comprises multiple RF transmission channels, and operating said RF system in said MR imaging sequence to radiate RF pulses simultaneously via said multiple RF transmission channels to selectively deflect said magnetization.

15. A method as claimed in claim 1 comprising operating said gradient coil system to radiate said spatially encoding magnetic field gradient as a slice selection gradient or a readout gradient that is a weighted linear combination of linear gradients and gradients of a higher order than said linear gradients.

16. A method as claimed in claim 1 comprising operating said basic field magnet to generate said first field inhomogeneity defined as a nonlinear gradient curve spatially described as $G(x,y,z)=z^2-(x^2+y^2)/2$.

17. A method as claimed in claim 1 wherein said RF system comprises multiple RF reception coils respectively having different reception coil sensitivities, and operating said RF system to detect said MR signal simultaneously with said multiple reception coils, and configuring said at least one spatially encoding magnetic field gradient and said at least one pulsed compensation magnetic field gradient dependent on the respective sensitivities according to a technique selected from the group consisting of the O-space technique and the null space technique.

18. A magnetic resonance (MR) apparatus comprising:
an MR data acquisition unit comprising a basic field magnet that generates a polarization field in a measurement region of the MR data acquisition unit, in which an examination region of an examination subject is situated, said polarization field producing a magnetization of nuclear spins in the examination region and said polarization field having a first field inhomogeneity across said measurement region;
said MR data acquisition unit comprising an RF system and a gradient coil system;
a control unit configured to operate said MR data acquisition unit according to an MR imaging sequence having a sequence duration and, in said MR imaging sequence, operate said RF system to radiate at least one RF pulse into an examination region that deflects said magnetization and thereby causes said nuclear spins to emit an MR signal;
said control unit being configured to operate said gradient coil system of said MR data acquisition unit to activate a spatially encoding magnetic field gradient that spatially codes said MR signal;

said control unit being configured to operate said gradient coil system of said MR data acquisition unit to activate at least one pulsed compensation magnetic field gradient during a compensation time interval in said MR imaging sequence that is shorter than said sequence duration and that occurs relative to the radiation of the at least one RF pulse so as to make said compensation field gradient effective during said at least one RF pulse, by supplying a temporally variable current, that is varying over said sequence duration, to said gradient coil system, and to configure said at least one pulsed compensation magnetic field gradient to reduce said first field inhomogeneity during said compensation time period to a second field inhomogeneity across said measurement field that is less than said first field inhomogeneity;

said control unit being configured to operate said MR data acquisition unit to detect said MR signal at least in said compensation time period; and said control unit being configured to convert the detected MR signal into an electrical signal representing raw MR data and entering said raw MR data into an electronic memory, to produce a raw data set in a form that is acceptable from said electronic memory for conversion into an image of the examination region.

19. An MR apparatus as claimed in claim 18 wherein said control unit being configured to operate said gradient coil system of said MR data acquisition unit to activate said at least one spatially encoding magnetic field gradient and to activate said at least one pulsed compensation magnetic field gradient, respectively, as a weighted linear combination of linear gradients and gradients of an order higher than said linear gradients.

20. An MR apparatus as claimed in claim 18 wherein said control unit being configured to operate said RF system of said MR data acquisition unit to radiate said at least one RF pulse during an RF radiation period, and to operate said gradient coil system of said MR data acquisition unit to activate said at least one pulsed compensation magnetic field gradient with said compensation time period substantially corresponding to said RF radiation period.

21. An MR apparatus as claimed in claim 18 wherein said control unit being configured to operate said MR data acquisition unit to only activate said spatially encoding magnetic field gradient or said pulsed compensation magnetic field gradient in said sequence duration.

22. An MR data acquisition unit as claimed in claim 18 comprising a processor, and wherein said control unit being configured to:

operate said MR data acquisition unit to detect said first field inhomogeneity, as detected field inhomogeneity information, and supply said detected field inhomogeneity information to said processor, said processor being configured to calculate a field map of said polarization field from the detected inhomogeneity information, said polarization field not representing a spatial dependency of said first field inhomogeneity; and said processor being configured to configure said at least one pulsed compensation magnetic field gradient to reduce said first field inhomogeneity to said second field inhomogeneity by calculating, a configuration of said variable current from the spatial dependency of the first field inhomogeneity in order to cause said at least one pulsed compensation magnetic field gradient to have a spatial dependency that reduces said first field inhomogeneity to said second field inhomogeneity.

23. An MR apparatus as claimed in claim 18 wherein said basic field magnet is a superconducting magnet comprising four superconducting coil elements that generate said polarization field in the z-direction of a Cartesian coordinate system, with two first coil elements, among said four coil elements, situated at a first end of said superconducting magnet along said z-direction, and two second coil elements, among said four coil elements, situated at a second, opposite end of said superconducting magnet along said z-direction.

24. An MR apparatus as claimed in claim 23 wherein said gradient coil system comprises a gradient coil having two coil portions that are respectively separated from each other in said z-direction.

25. An MR apparatus as claimed in claim 24 wherein said gradient coil has a size that projects, on both sides along said z-direction, beyond said coil elements of said superconducting magnet.

* * * * *